United States Patent [19]

Grace et al.

[11] Patent Number: 5,548,538

[45] Date of Patent: Aug. 20, 1996

[54] INTERNAL AUTOMATIC CALIBRATOR FOR VECTOR NETWORK ANALYZERS

[75] Inventors: Martin I. Grace, San Jose; William W. Oldfield, Redwood City, both of Calif.

[73] Assignee: Wiltron Company, Morgan Hill, Calif.

[21] Appl. No.: 350,563

[22] Filed: Dec. 7, 1994

[51] Int. Cl.$^6$ .................................................. G01R 35/00
[52] U.S. Cl. .................... 364/571.04; 324/605; 324/650; 324/642
[58] Field of Search .................. 364/571.04, 571.01, 364/571.02, 571.07, 481–487; 333/17.1, 18; 324/606, 605, 612, 74, 601, 650, 615, 649, 642, 637, 616, 617, 618, 619; 356/73.1, 72; 361/76

[56] References Cited

U.S. PATENT DOCUMENTS

| | | | |
|---|---|---|---|
| 4,703,433 | 10/1987 | Sharrit | 364/485 |
| 4,816,767 | 3/1989 | Cannon et al. | 324/77 B |
| 4,839,578 | 6/1989 | Roos | 324/58 R |
| 5,028,131 | 7/1991 | Dunsmore | 356/73.1 |
| 5,313,166 | 5/1994 | Eul et al. | 324/601 |
| 5,332,974 | 7/1994 | Harkins et al. | 324/606 |

OTHER PUBLICATIONS

Engen, Glenn F., et al., *The Multi–State Two Port: An Altrnative Transfer Standard*, ARFTG Diges, 1993 month unknown.

Adamian, V., John "A Novel Procedure for Network Analyzer Calibration and Verification", Automatic RF Techniques Group, 41st ARFTG Abstracts Package (Jun. 18, 1993).

Ferrero, Andrea "Two–Part Network Analyzer Calibration Using an Unknown 'Thru'", IEEE Microwave and Guided Wave Letters (Dec. 1992), vol. 2, No. 12, pp. 505–507.

Adamian V. "A Novel Procedure For Network Analyzer Calibration and Verification", ARFTG Digest, Spring 93, pp. 1–10.

U.S. Patent Application entitled, "Automatic VNA Calibration Apparatus", Ser. No. 08/140,781, Filed Oct. 21, 1993.

*Primary Examiner*—James P. Trammell
*Attorney, Agent, or Firm*—Fliesler, Dubb, Meyer & Lovejoy

[57] ABSTRACT

A calibration technique for a vector network analyzer (VNA) enabling calibration standards to be included internal to the VNA. To calibrate the VNA utilizing the internal calibration standards, error terms a, b and c of two two-port error boxes E are defined between the measurement ports and the reflectometer of the VNA wherein $a=-\det(E)$, $b=e00$ and $c=e10$. Error terms a, b and c are determined by measuring external calibration standards with known reflection coefficients connected directly to the measurement ports. Reflection coefficients for internal calibration standards are then determined using the error terms a, b and c to enable future automatic calibrations. To measure S-parameters of an arbitrary device under test (DUT), one embodiment of the present invention uses the Ferrero technique to measure a reciprocal thru with estimated $S_{21}$ characteristics connected between ports A and B to determine an additional error term $\alpha$ for the error boxes E, where $\alpha=e01_A/e_{01B}$. In another embodiment a thru is measured which is not required to be reciprocal or to have known $S_{21}$ characteristics, both alone and in series with the DUT.

13 Claims, 3 Drawing Sheets

INTERNAL AUTOMATIC CALIBRATOR FOR VECTOR NETWORK ANALYZERS

BACKGROUND OF THE INVENTION

1. Field of the Invention

The present invention relates to the calibration of a vector network analyzer (VNA). More particularly, the present invention relates to automatic calibration of a VNA with calibration standards provided internal to the VNA.

2. Description of the Related Art

In the past, two port VNAs were calibrated with calibration standards to determine S-parameters at the measurement ports of the VNA which take into account vector error correction terms to enhance the accuracy of the VNA. A typical calibration technique required the separate connection of four calibration standards (thru, match, short, open) with known "perfect" parameters and an operator to press buttons to enable measurements to be taken for each calibration standard.

Recently, calibration techniques have been developed which allow for partially unknown standards. One such calibration technique is described in an article entitled "Two-Port Network Analyzer Calibration Using an Unknown 'Thru'", by Andrea Ferrero and Umberto Pisani, IEEE Microwave and Guided Wave Letters, Vol. 2, No. 12, December 1992, pp. 505–507 (hereinafter, Ferrero), which is incorporated herein by reference. The Ferrero technique does not require any particular knowledge of a thru standard, other than an estimation of its $S_{21}$ phase shift and that the thru be a reciprocal device.

The Ferrero technique enables calibration of a VNA by measuring the scattering matrix of an unknown thru as a device under test (DUT) plus the reflection coefficients of a short, open and load to determine error terms composed of particular S-parameters of two error boxes $E_A$ and $E_B$ between the ports of the VNA and a two port reflectometer of the VNA as shown in FIG. 1.

Also recently, devices have been developed to automate steps of the calibration process. One such device is described in U.S. patent application Ser. No. 08/140,781, entitled "Automatic VNA Calibration Apparatus", by Oldfield et al., filed Oct. 21, 1993 (hereinafter, Oldfield), also incorporated herein by reference. Oldfield describes a device used for automation of the steps of attaching and removing calibration standards as well as steps where the operator presses buttons to perform calibration measurements. The device described in Oldfield is a box containing calibration standards with the box being attachable to the ports of the VNA. Electronically controlled switches are included in the box to individually connect the calibration standards one at a time to a port of the VNA for calibration measurements. The box also includes circuitry connectable to the VNA to provide information required for measurement of each calibration standard, rather than requiring an operator to press buttons on the VNA between measurements for each standard.

SUMMARY OF THE INVENTION

The present invention combines features of the Ferrero calibration technique and the Oldfield device to enable calibration standards to be provided internal to the VNA, enabling the calibration process to be further automated.

The present invention further modifies the Ferrero technique to eliminate the requirement of knowledge of the $S_{21}$ phase shift of a thru calibration standard.

The present invention includes short, open and load reflection calibration standards provided internal to a VNA as opposed to being contained in a box external to the VNA as with the Oldfield device. Further, as with the Oldfield device, electronic switches are provided to individually connect the short, open and loads to the reflectometer of the VNA. Unlike with the Oldfield device, however, the internal reflection calibration standards of the present invention are not connected directly to the test ports to the VNA. Instead, the electronic switches are utilized to separately connect the reflectometer to the internal reflection calibration standards or to the measurement ports.

To calibrate the VNA utilizing the internal reflection calibration standards, the present invention first utilizes the Ferrero technique to determine error terms $a_A$, $b_A$ and $c_A$ for error box $E_A$ and error terms $a_B$, $b_B$ and $c_B$ for error box $E_B$ wherein:

$$E_A = \begin{bmatrix} e00_A & e01_A \\ e10_A & e11_A \end{bmatrix} \quad E_B = \begin{bmatrix} e00_B & e01_B \\ e10_B & e11_B \end{bmatrix}$$

where:
$a_A = -det(E_A)$;
$b_A = e00_A$; and
$c_A = e11_A$.

where:
$a_B = -det(E_B)$;
$b_B = e00_B$; and
$c_B = e11_B$.

The error terms are determined by controlling the electronic switches to connect ports A and B to the reflectometer to measure the reflection coefficients $\Gamma m1$, $\Gamma m2$ and $\Gamma m3$ for respective external calibration standards including a short, an open and a load having known reflection coefficient values $\Gamma c1$, $\Gamma c2$ and $\Gamma c3$ connected to each of ports A and B of the VNA. The following matrix of equations is then solved for each port to determine the values of a, b and c for that respective port:

$$\begin{bmatrix} \Gamma m1 \\ \Gamma m2 \\ \Gamma m3 \end{bmatrix} = \begin{bmatrix} \Gamma c1 & 1 & -(\Gamma m1 \cdot \Gamma c1) \\ \Gamma c2 & 1 & -(\Gamma m2 \cdot \Gamma c2) \\ \Gamma c3 & 1 & -(\Gamma m3 \cdot \Gamma c3) \end{bmatrix} \begin{bmatrix} a \\ b \\ c \end{bmatrix}$$

The measured reflection coefficients $\Gamma mi$ for the respective internal reflection calibration standards for each port are then measured by controlling the electronic switches to connect the respective short, open and load of the internal reflection calibration standards to the reflectometer. Reflection coefficient values $\Gamma ci$ are then calculated for each internal reflection calibration standard using the following equation:

$$\Gamma ci = \frac{\Gamma mi - b}{a + \Gamma mi \cdot c}$$

The reflection values $\Gamma ci$ for the internal reflection calibration standards can now be utilized to determine new values for a, b and c for each of ports A and B if desired at a later time and the external calibration standards are no longer required.

To measure the S-parameters of an arbitrary DUT, in one embodiment, the present invention continues utilizing the Ferrero technique to determine an additional error term $\alpha$, where $\alpha = e01_A/e01_B$. The term $\alpha$ is then determined by measuring scattering parameters for a reciprocal thru having an estimated $S_{21}$ phase shift as a DUT to obtain transmission parameters $T_{mc}$. Utilizing the values $T_{mc}$ and the now known values for a, b and c for each port, the following matrix equation, as identified in Ferrero, is defined:

$$T_{mc} = \alpha Y_A T_{DUT} Y_B^{-1}$$

where:

$$Y_A = \begin{bmatrix} \dfrac{-a_A}{(a_A + b_A \cdot c_A)} & \dfrac{b_A}{(a_A + b_A \cdot c_A)} \\ \dfrac{-c_A}{(a_A + b_A \cdot c_A)} & \dfrac{1}{(a_A + b_A \cdot c_A)} \end{bmatrix} ; \text{ and}$$

$$Y_B = \begin{bmatrix} \dfrac{1}{(a_B + b_B \cdot c_B)} & \dfrac{-c_B}{(a_B + b_B \cdot c_B)} \\ \dfrac{b_B}{(a_B + b_B \cdot c_B)} & \dfrac{-a_B}{(a_B + b_B \cdot c_B)} \end{bmatrix}$$

By taking determinants, we eliminate $T_{DUT}$, which for a reciprocal device has a unity determinant, and solve for $\alpha$ as follows:

$$\alpha = \pm \sqrt{\dfrac{det(T_{mC}) det(Y_b)}{det(Y_A)}}$$

The sign of alpha is then determined utilizing the estimated $S_{21}$ phase shift for the reciprocal thru and the following equation:

$$S_{21c} = \dfrac{\alpha}{X_{22}}$$

where:

$$X = Y_A^{-1} T_{mC} Y_B;$$

and $S_{21}$ is the actual $S_{21}$ parameter of the reciprocal thru. Having solved for $\alpha$, $Y_A$ and $Y_B$, $T_{DUT}$ can now be determined for any arbitrary DUT as can the S-parameters for the arbitrary DUT.

In a second embodiment, the present invention determines the S-parameters for an arbitrary DUT without using $\alpha$ by first measuring the raw S-parameters for an arbitrary thru to obtain transmission parameters $T_{mc}$. In this embodiment the arbitrary thru is not required to be reciprocal, or to have known $S_{21}$ phase characteristics. Additionally, raw S-parameters are measured for an arbitrary DUT connected in series with the arbitrary thru to obtain a transmission matrix, $T_{mDC}$. The following two matrix equations for the actual transmission matrices for the arbitrary thru, $T_c$, and the measured transmission matrix, $T_{mDC}$, for the series arbitrary thru and arbitrary DUT:

$$T_C = \alpha^{-1} Y_A^{-1} T_{mc} Y_B;$$

and $$T_{mDC} = \alpha Y_A T_D T_C Y_B^{-1}$$

are then solved for the actual transmission matrix of the actual DUT, $T_D$, to eliminate $\alpha$ and obtain:

$$T_D = Y_A^{-1} T_{mDC} T_{mC}^{-1} Y_A$$

Since $Y_A$, $T_{mDC}$ and $T_{mc}$ are now known, $T_D$ can be determined as can the S-parameters for the arbitrary DUT.

BRIEF DESCRIPTION OF THE DRAWINGS

Further details of the present invention are explained with the help of the attached drawings in which.

DETAILED DESCRIPTION

Figure 2:
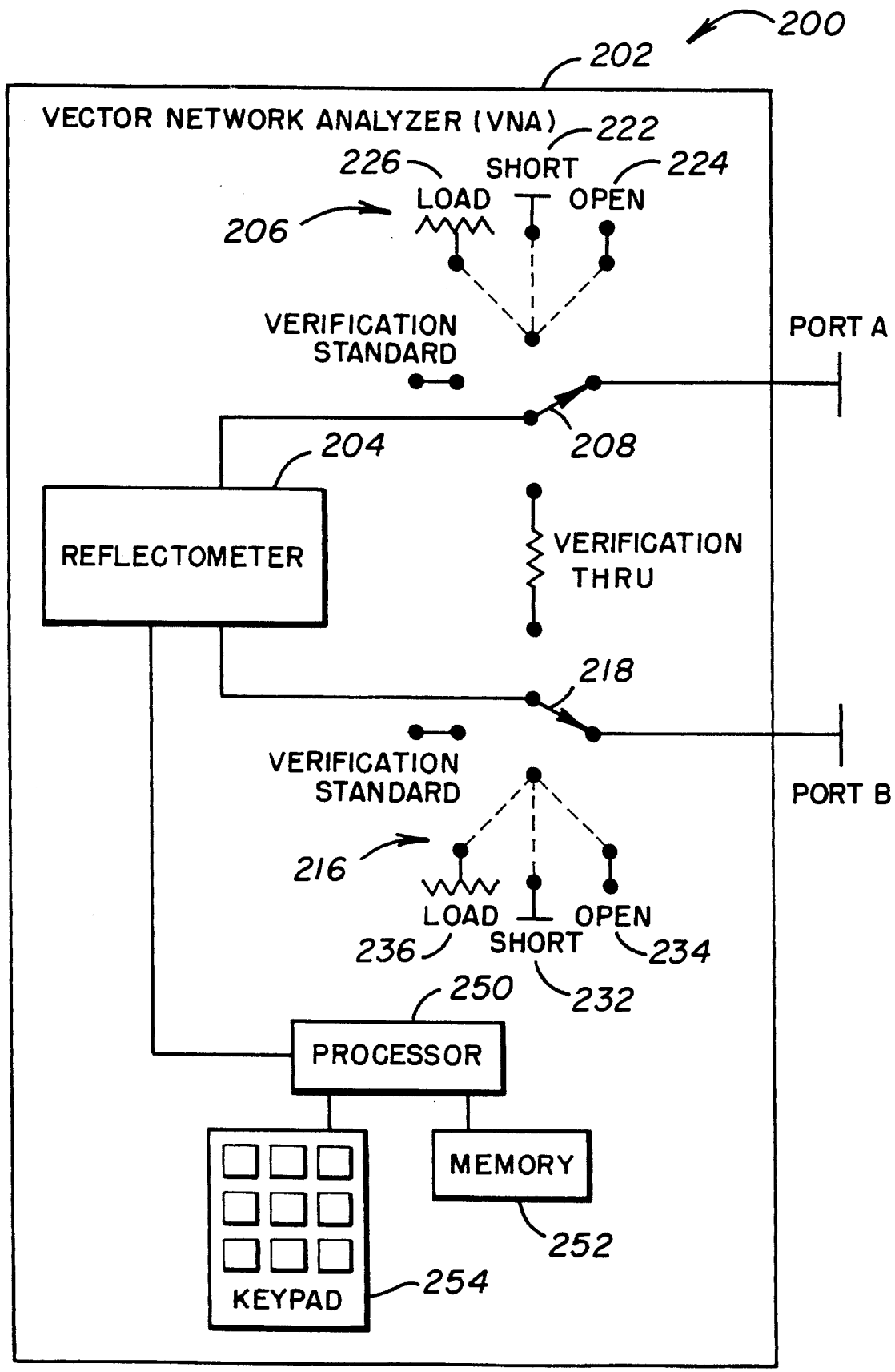
FIG. 2 shows a block diagram for a VNA configured to provide the automatic internal calibration of the present invention.

FIG. 2 shows a block diagram for a VNA 200 of the present invention configured to provide automatic internal calibration. As shown in FIG. 2, within a housing 202 the VNA includes a reflectometer 204, two calibration modules 206 and 216, and electronic PIN switches 208 and 218. Signal connections to the reflectometer of the VNA are made by each of the electronic PIN switches 208 and 218 to respective ports A and B of the VNA, or to components of respective calibration modules 206 and 216. Reflection and thru lines used for verification of a calibration are also included within the housing 202 and are connectable to the reflectometer 204 using pin switches 208 and 218.

The components of the calibration module 206 include internal reflection calibration standards approximating a short 222, an open 224 and a matched load 226, while components of calibration module 216 include internal reflection calibration standards approximating a short 232, an open 234 and a matched load 236. The internal reflection calibration standards approximate rather than provide "perfect" standards, as in the Oldfield device, and are constructed using pin diodes which are either shorted, left open or connected to a 50 Ω load.

The VNA further includes a processor 250, a memory 252 for storing data and an input/output (I/O) control unit, such as keypad 254, which is accessible to a user. The processor 250 is connected to receive signals from the I/O control unit, such as keypad 254, enabling a user to control calibration and measurement processes. The processor 250 is further connected to receive signals from the reflectometer 204 and to store data in the memory 252 representative of the signals received as well as data necessary for general operation.

Characterizing Internal Reflection Calibration Standards

For automatic calibration, since the internal reflection calibration standards are non ideal and cannot be connected directly to the ports of the VNA, calibration terms must be determined which account for the alternate location and non ideal characteristics of the internal reflection calibration standards. To provide such calibration terms, the present invention utilizes error terms made up of particular S-parameters of error boxes $E_A$ and $E_B$ similar to Ferrero. The error terms of the error boxes $E_A$ and $E_B$ are derived from measurements of external calibration standards. To account for the alternate location and non ideal characteristics of the internal reflection calibration standards, the error terms of error boxes $E_A$ and $E_B$ derived from measurements of the external calibration standards are assumed to be the same for the internal reflection calibration standards for initial measurement and characterization of the internal reflection calibration standards. Subsequent measurements of the internal reflection calibration standards can then be made should changes occur to recalculate the error terms without further measurement of the external calibration standards.

Figure 3:
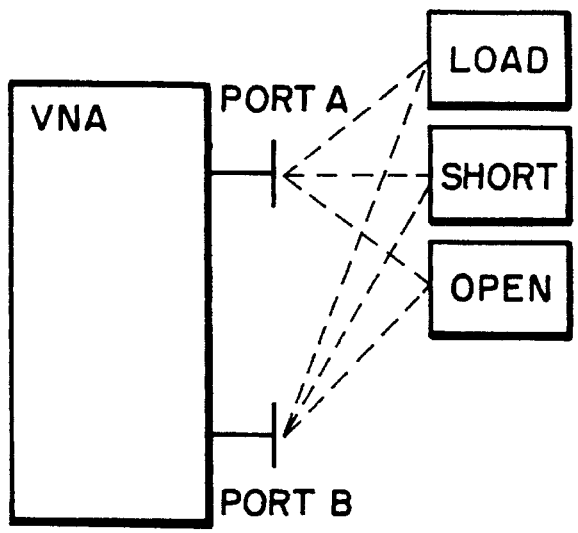
FIG. 3 illustrates measurement of an external short, open and load.

In particular, to determine the error terms needed to characterize the internal reflection calibration standards, the first step is to measure reflection coefficients for the external calibration standards including a short, open and load provided separate from the internal reflection calibration standards and having known "perfect" characteristics as illustrated in FIG. 3. Using the measured reflection coefficients for the external calibration standards, in a next step the processor 250 makes mathematical calculations to determine the particular S-parameters making up the error terms.

To derive mathematical formulas utilized by the processor 250 to calculate the error terms, we begin by definin the S-parameters for an error box E as follows:

$$E = \begin{pmatrix} e00 & e01 \\ e10 & e11 \end{pmatrix} \tag{1}$$

The particular S-parameters making up the error terms are calculated in terms of measured and known reflection coefficients of the external calibration coefficients using the following well known equation:
where:

$$\Gamma m = e00 + \frac{e01 \cdot e10 \cdot \Gamma c}{1 - e11 \cdot \Gamma c} \tag{2}$$

$\Gamma c$ is the known reflection coefficient for a calibration standard; and $\Gamma m$ is the measured reflection coefficient for the calibration standard at a particular test port.

Solving equation (2), we define the error terms a, b and c in terms of the particular S-parameters as follows:

$$\begin{aligned} \Gamma m &= \frac{e00 - (e00 \cdot e11 - e01 \cdot e10) \cdot \Gamma c}{1 - e11 \cdot \Gamma c} \\ &= \Gamma c \cdot (e10 \cdot e01 - e00 \cdot e11) + e00 + \Gamma m \cdot e11 \cdot \Gamma c \\ &= \Gamma c \cdot a + b + \Gamma m \cdot \Gamma c \cdot c \end{aligned} \tag{3}$$

where:

a=−det(E)=(e10·e01−e00·e11);

b=e00; and c=e11.

Utilizing equation (3), the measured reflection coefficients $\Gamma m1$, $\Gamma m2$ and $\Gamma m2$ for a short, open and load and the known reflection coefficients $\Gamma c1$, $\Gamma c2$ and $\Gamma c3$ for the short, open and load, the following matrix of equations can be obtained:

$$\begin{bmatrix} \Gamma m1 \\ \Gamma m2 \\ \Gamma m3 \end{bmatrix} = \begin{bmatrix} \Gamma c1 & 1 & -(\Gamma m1 \cdot \Gamma c1) \\ \Gamma c2 & 1 & -(\Gamma m2 \cdot \Gamma c2) \\ \Gamma c3 & 1 & -(\Gamma m3 \cdot \Gamma c3) \end{bmatrix} \begin{bmatrix} a \\ b \\ c \end{bmatrix} \tag{4}$$

Solving for a, b, and c we obtain:

$$a = \frac{(\Gamma m1 \cdot \Gamma m3 \cdot \Gamma c3 - \Gamma m1 \cdot \Gamma m2 \cdot \Gamma c2 - \Gamma m2 \cdot \Gamma m3 \cdot \Gamma c3 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 +} \tag{5}$$

$$\frac{\Gamma m2 \cdot \Gamma m1 \cdot \Gamma c1 + \Gamma m3 \cdot \Gamma m2 \cdot \Gamma c2 - \Gamma m3 \cdot \Gamma m1 \cdot \Gamma c1)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)}$$

$$b = \frac{(-\Gamma c3 \cdot \Gamma c2 \cdot \Gamma m1 \cdot \Gamma m3 + \Gamma c3 \cdot \Gamma c2 \cdot \Gamma m1 \cdot \Gamma m2 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot} \tag{6}$$

$$\frac{\Gamma c3 \cdot \Gamma c1 \cdot \Gamma m2 \cdot \Gamma m3 - \Gamma c3 \cdot \Gamma c1 \cdot \Gamma m2 \cdot \Gamma m1 -}{\Gamma c3 + \Gamma c2 \cdot \Gamma m1 \cdot \Gamma c1 + \Gamma c3 \cdot \Gamma m1 \cdot \Gamma c2 - \Gamma c3 \cdot}$$

$$\frac{\Gamma c2 \cdot \Gamma c1 \cdot \Gamma m3 \cdot \Gamma m2 + \Gamma c2 \cdot \Gamma c1 \cdot \Gamma m3 \cdot \Gamma m1)}{\Gamma m1 \cdot \Gamma c1)}$$

$$c = \frac{(\Gamma c2 \cdot \Gamma m1 - \Gamma c3 \cdot \Gamma m1 - \Gamma c1 \cdot \Gamma m2 + \Gamma c3 \cdot \Gamma m2 + \Gamma c1 \cdot}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 \cdot} \tag{7}$$

$$\frac{\Gamma m3 - \Gamma c2 \cdot \Gamma m3)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)}$$

The processor 250, thus, utilizes the measured and known reflection coefficients of the external calibration standards at each of ports A and B of a VNA and equations (5)–(7) to determine the error terms, which for port A include $a_A$, $b_A$ and $c_A$ and for port B include $a_B$, $b_B$ and $c_B$.

To proceed with the characterization of the internal reflection calibration standards, the next step of the present invention is to measure reflection coefficients, $\Gamma mi$, for each of the internal reflection calibration standards at each of ports A and B. The processor 250 utilizes the measured reflection coefficients, $\Gamma mi$, to calculate individual reflection coefficients, $\Gamma ci$, one for each of the internal reflection calibration standards. The reflection coefficients, $\Gamma ci$, can be calculated by assuming the internal reflection calibration standards produce the same error terms a, b and c at a particular port of the VNA as the external standards and solving the following equation derived from equation (3) for each of the internal reflection calibration standards:

$$\Gamma ci = \frac{\Gamma mi - b}{a + \Gamma mi \cdot c} \tag{8}$$

The reflection coefficients, $\Gamma ci$, for the internal reflection calibration standards now serve as the known or characterized reflection coefficients for future automatic calibrations. Measurements of the external calibration standards are no longer necessary.

If a new set of error terms is desired due to circumstances such as changes in time and temperature, the user need only utilize the I/O control unit, such as keypad 254, to initiate an auto-calibration process to calculate new error terms. Initiation of the auto-calibration process causes the processor 250 to determine new error terms by controlling the PIN switches 208 and 218 to connect the reflectometer to the calibration modules 206 and 216 to measure the reflection coefficients for each of the internal reflection calibration components. The processor 250 then utilizes these measured reflection coefficients and the now characterized reflection coefficients, $\Gamma ci$, for the internal reflection calibration components to calculate a new set of error terms $a_A$, $b_A$, $c_A$, $a_B$, $b_B$ and $c_B$ using equations (5)–(7). The new set of error terms are then stored in memory 252 by processor 250 to prepare for measurement of an arbitrary device under test (DUT).

Measuring A Device Under Test

A. First Embodiment

Figure 4:
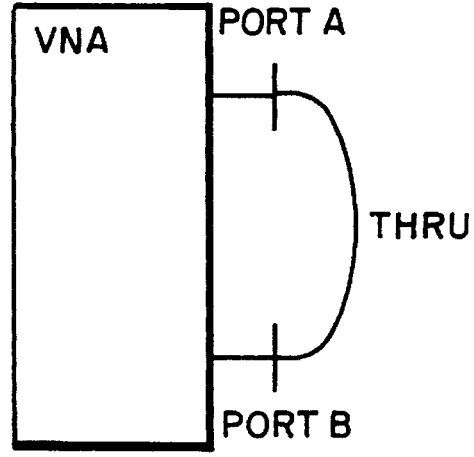
FIG. 4 illustrates measurement of a thru line.

To complete calibration and enable measurement of an arbitrary DUT, in one embodiment of the present invention the S-parameters of a reciprocal thru with a known $S_{21}$ phase shift are measured as illustrated in FIG. 4, and the Ferrero technique is utilized to determine an additional error term α.

The Ferrero technique begins by defining a first matrix $Y_A$ solely in terms of error terms $a_A$, $b_B$ and $c_C$ and a second matrix $Y_B$ solely in terms of error terms $a_B$, $b_B$ and $c_B$ as follows:

$$Y_A = \begin{bmatrix} \dfrac{-a_A}{e10_A \cdot e01_A} & \dfrac{b_A}{e10_A \cdot e01_A} \\ \dfrac{-c_A}{e10_A \cdot e01_A} & \dfrac{1}{e10_A \cdot e01_A} \end{bmatrix} \quad (9)$$

$$= \begin{bmatrix} \dfrac{-a_A}{a_A + b_A \cdot c_A} & \dfrac{b_A}{(a_A + b_A \cdot c_A)} \\ \dfrac{-c_A}{a_A + b_A \cdot c_A} & \dfrac{1}{(a_A + b_A \cdot c_A)} \end{bmatrix}$$

$$Y_B = \begin{bmatrix} \dfrac{1}{e10_B \cdot e01_B} & \dfrac{-c_B}{e10_B \cdot e01_B} \\ \dfrac{b_B}{e10_B \cdot e01_B} & \dfrac{-a_B}{e10_B \cdot e01_B} \end{bmatrix} \quad (10)$$

$$= \begin{bmatrix} \dfrac{1}{a_B + b_B \cdot c_B} & \dfrac{-c_B}{(a_B + b_B \cdot c_B)} \\ \dfrac{b_B}{a_B + b_B \cdot c_B} & \dfrac{-a_B}{(a_B + b_B \cdot c_B)} \end{bmatrix}$$

Further, a transmission matrix $T_m$ is defined in terms of the measured scattering matrix $S_m$ for a device under test as follows:

$$T_m = \begin{bmatrix} \dfrac{-det(S_m)}{S_{21m}} & \dfrac{S_{11m}}{S_{21m}} \\ \dfrac{-S_{22m}}{S_{21m}} & \dfrac{1}{S_{21m}} \end{bmatrix} \quad (11)$$

Figure 1:
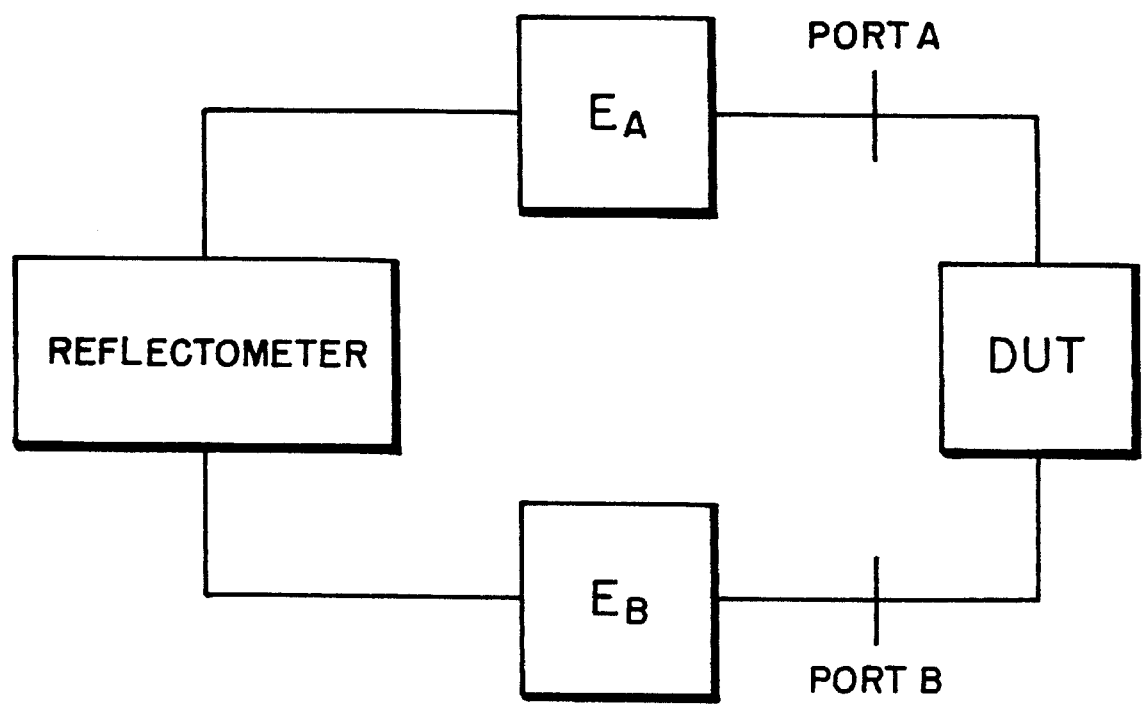
FIG. 1 illustrates a mathematical model for determining the S-parameters at the test ports of a VNA.

Using the model of FIG. 1, the following equation is then derived:

$$T_m = \alpha Y_A T_{DUT} Y_B^{-1} \quad (12)$$

where:
$T_{DUT}$ is the actual transmission matrix of the device under test; and
$\alpha = e01_A/e01_B$ Solving equation (12) for the actual transmission matrix of the DUT we obtain:

$$T_{DUT} = \alpha^{-1} Y_A^{-1} T_m Y_B \quad (13)$$

To measure a DUT, since $Y_A$, $Y_B$ and $T_m$ can be determined, $\alpha$ must be determined. To solve for $\alpha$, Ferrero discovered that when using a reciprocal device as a DUT to yield a measured transmission matrix $T_{mc}$ and an actual transmissionmatrix, $T_c$, which for a reciprocal device has a unitary determinant, the following equation can be derived from equation (12):

$$det(T_{mC}) = \alpha^2 det(Y_A) det(Y_B^{-1}) \quad (14)$$

allowing a solution for $\alpha$ as follows:

$$\alpha = \pm \sqrt{\dfrac{det(T_{mC}) det(Y_B)}{det(Y_A)}} \quad (15)$$

with the determinants of $Y_A$, $Y_B$ and $T_{mC}$ derived from equations (9)–(11) as follows:

$$det(Y_A) = \dfrac{-(a_A - b_A \cdot c_A)}{(a_A + b_A \cdot c_A)^2} \quad (16)$$

$$det(Y_B) = \dfrac{-(a_B - b_B \cdot c_B)}{(a_B + b_B \cdot c_B)^2} \quad (17)$$

$$det(T_{mC}) = \dfrac{-S_{12mC}}{S_{21mC}} \quad (18)$$

then:

$$\alpha = \pm \sqrt{\dfrac{-S_{12mC} \cdot (a_B - b_B \cdot c_B) \cdot (a_A + b_A \cdot c_A)^2}{S_{21mC} \cdot [(a_B + b_B \cdot c_B)^2 \cdot (a_A - b_A \cdot c_A)]}} \quad (19)$$

Thus, utilizing the error terms $a_A$, $b_A$, $c_A$, $a_B$, $b_B$ and $c_B$ now stored in memory 252 and the measured scattering matrix for the reciprocal thru, the processor 250 of the VNA can determine the term $\alpha$ from equation (19), except for a sign ambiguity.

To solve the sign ambiguity for $\alpha$, Ferrero defines a term X as follows:

$$X = Y_A^{-1} T_{mC} Y_B \quad (20)$$

By solving equation (13) for the actual transmission coefficient of the reciprocal thru, $T_{22C}$, where $T_{22C} = 1/S_{21C}$, we further obtain:

$$S_{21c} = \dfrac{\alpha}{X_{22}} \quad (21)$$

By having a knowledge of the $S_{21}$ phase shift of the reciprocal thru and being able to solve for alpha $\alpha$ from equation (15) except for its sign, and solving for X as follows:

$$X = \begin{bmatrix} \dfrac{(a_A + b_A \cdot c_A)}{(-a_A + b_A \cdot c_A)} & \dfrac{-b_A(a_A + b_A \cdot c_A)}{(-a_A + b_A \cdot c_A)} \\ \dfrac{c_A(a_A + b_A \cdot c_A)}{(-a_A + b_A \cdot c_A)} & \dfrac{-a_A(a_A + b_A \cdot c_A)}{(-a_A + b_A \cdot c_A)} \end{bmatrix} \quad (22)$$

$$\begin{bmatrix} \dfrac{-det(S_{mC})}{S_{21mC}} & \dfrac{S_{11mC}}{S_{21mC}} \\ \dfrac{-S_{22mC}}{S_{21mC}} & \dfrac{1}{S_{21mC}} \end{bmatrix} \begin{bmatrix} \dfrac{1}{(a_B + b_B \cdot c_B)} & \dfrac{-c_B}{(a_B + b_B \cdot c_B)} \\ \dfrac{b_B}{(a_B + b_B \cdot c_B)} & \dfrac{-a_B}{(a_B + b_B \cdot c_B)} \end{bmatrix}$$

from which $X_{22}$ is obtained as follows:

$$X_{22} = \dfrac{(a_A + b_A \cdot c_A)}{(-a_A + b_A \cdot c_A) \cdot [S_{21mC} \cdot (a_B + b_B \cdot c_B)]} \cdot (-c_B \cdot c_A \cdot \quad (23)$$

$$S_{11mC} \cdot S_{22mC} + c_B \cdot c_A \cdot S_{12mC} \cdot S_{21mC} + c_B \cdot a_A \cdot S_{22mC} -$$

$$a_B \cdot c_A \cdot S_{11mC} + a_B \cdot a_A)$$

the processor 250 can use equation (21) to determine the sign of $\alpha$. An estimate of the $S_{21}$ phase shift is made by the processor 250 to determine the sign of $\alpha$ using a measurement of the length of the reciprocal thru provided by a user through the I/O control unit such as keypad 254. The value for $\alpha$ is then calculated by the processor 250 and stored in memory 252 as described above. With $Y_A$, $Y_B$ and $\alpha$ now being determined, calibration is complete.

Figure 5:
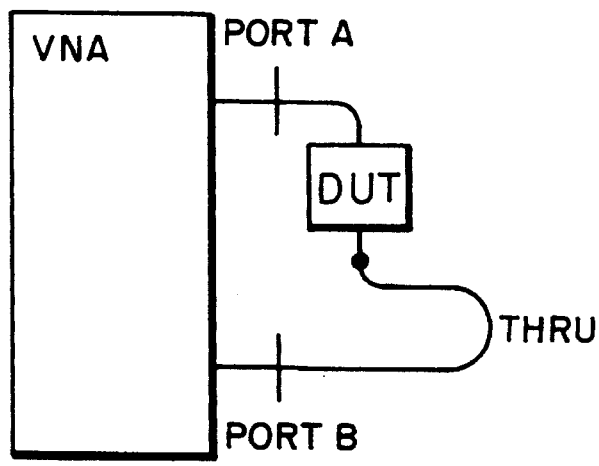
FIG. 5 illustrates measurement of a device under test in series with a thru line with the thru line connected directly to port B.

To measure an arbitrary DUT, the arbitrary DUT is typically connected in series with the reciprocal thru between ports A and B of the VNA as illustrated in FIG. 5. With $Y_A$, $Y_B$ and $\alpha$ being known constants, an actual transmission matrix, $T_{DC}$, for the series connected reciprocal thru and arbitrary DUT can be obtained from equation (13) as follows:

$$T_{DC} = \alpha^{-1} Y_A^{-1} T_{mDC} Y_B \quad (24)$$

where:
$T_{mDC}$ is the measured transmission matrix for the series connected reciprocal thru and arbitrary DUT.

Further, utilizing equation (13) and the measurement for the transmission parameters of the reciprocal thru, $T_{mC}$, when only the reciprocal thru is connected from port A to port B, we obtain the actual transmission parameters for the reciprocal thru $T_c$ as follows:

$$T_C = \alpha^{-1} Y_A^{-1} T_{mC} Y_B \quad (25)$$

Since:

$$T_{DC} = T_D \cdot T_C \quad (26)$$

where:

$T_c$ is the actual transmission matrix for the arbitrary thru alone; and $T_D$ is the actual transmission matrix for the arbitrary DUT alone, utilizing the solution for $T_{DC}$ and $T_D$ from equations (24) and (25) and solving equation (26) for $T_D$ we obtain:

$$
\begin{aligned}
T_D &= T_{DC} T_C^{-1} \\
&= \begin{bmatrix} T_{11DC} & T_{12DC} \\ T_{21DC} & T_{22DC} \end{bmatrix} \begin{bmatrix} \dfrac{-T_{22C}}{(-T_{11C} \cdot T_{22C} + T_{12C} \cdot T_{21C})} & \dfrac{-T_{12C}}{(-T_{11C} \cdot T_{22C} + T_{12C} \cdot T_{21C})} \\ \dfrac{T_{21C}}{(-T_{11C} \cdot T_{22C} + T_{12C} \cdot T_{21C})} & \dfrac{-T_{11C}}{(-T_{11C} \cdot T_{22C} + T_{12C} \cdot T_{21C})} \end{bmatrix} \\
&= \begin{bmatrix} \dfrac{(-T_{11DC} \cdot T_{22C} + T_{12DC} \cdot T_{21C})}{(-T_{11C} \cdot T_{22C} + T_{12C} \cdot T_{21C})} & \dfrac{(T_{11DC} \cdot T_{12C} - T_{12DC} \cdot T_{11C})}{(-T_{11C} \cdot T_{22C} + T_{12C} \cdot T_{21C})} \\ \dfrac{(-T_{21DC} \cdot T_{22C} + T_{22DC} \cdot T_{21C})}{(-T_{11C} \cdot T_{22C} + T_{12C} \cdot T_{21C})} & \dfrac{-(-T_{21DC} \cdot T_{12C} + T_{22DC} \cdot T_{11C})}{(-T_{11C} \cdot T_{22C} + T_{12C} \cdot T_{21C})} \end{bmatrix}
\end{aligned}
\quad (27)
$$

Once the transmission parameters for the arbitrary DUT are determined, the actual S-parameters, $S_D$, for the arbitrary DUT can be derived from its transmission parameters, $T_D$, as follows:

$$
\begin{aligned}
S_D &= \begin{bmatrix} \dfrac{T_{12D}}{T_{22D}} & \dfrac{det(T_D)}{T_{22D}} \\ \dfrac{1}{T_{22D}} & \dfrac{-T_{21D}}{T_{22D}} \end{bmatrix} \\
&= \begin{bmatrix} \dfrac{(T_{11DC} \cdot T_{12C} - T_{12DC} \cdot T_{11C})}{(-T_{21DC} \cdot T_{12C} + T_{22DC} \cdot T_{11C})} & \dfrac{(-T_{12DC} \cdot T_{21DC} + T_{11DC} \cdot T_{22DC})}{(-T_{21DC} \cdot T_{12C} + T_{22DC} \cdot T_{11C})} \\ \dfrac{-(-T_{11C} \cdot T_{22C} + T_{12C} \cdot T_{21C})}{(-T_{21DC} \cdot T_{12C} + T_{22DC} \cdot T_{11C})} & \dfrac{(-T_{21DC} \cdot T_{22C} + T_{22DC} \cdot T_{21C})}{(-T_{21DC} \cdot T_{12C} + T_{22DC} \cdot T_{11C})} \end{bmatrix}
\end{aligned}
\quad (28)
$$

B. Second Embodiment

In a second embodiment of the present invention, calibration is completed and measurement of an arbitrary DUT is accomplished by measurement of an arbitrary thru as illustrated in FIG. 4, and further measurement of the arbitrary thru in series with the arbitrary DUT as illustrated in FIG. 5. Unlike with the first embodiment, the arbitrary thru measured does not have to be a reciprocal device, nor is any knowledge of its $S_{21}$ phase shift required.

To derive equations for the second embodiment, we begin with the measured scattering parameters of the arbitrary thru as a DUT to obtain a measured transmission matrix $T_{mC}$ using equation (11). Additionally the definitions of $Y_A$, $Y_B$ and $\alpha$ from Ferrero are used in equation (12) to provide an equation where the actual transmission matrix for the arbitrary thru $T_c$ and $\alpha$ remain unknown as follows:

$$T_{mC} = \alpha Y_A T_C Y_B^{-1} \quad (29)$$

Solving for $T_c$ as in equation (13) we obtain:

$$T_C = \alpha^{-1} Y_A^{-1} T_{mC} Y_B \quad (30)$$

Additionally using the measurement for the reciprocal thru connected in series with the arbitrary DUT as a DUT the following equation is derived:

$$T_{mDC} = \alpha Y_A T_D T_C Y_B^{-1} \quad (31)$$

where:

$T_{mDC}$ is the measured transmission matrix for the series connected arbitrary thru and arbitrary DUT;

$T_c$ is the actual transmission matrix for the arbitrary thru alone; and $T_D$ is the actual transmission matrix for the arbitrary DUT alone.

Substituting $T_c$ from equation (30) into equation (31) and solving for $T_D$, can be eliminated to obtain:

$$T_D = Y_A^{-1} T_{mDC} T_{mC}^{-1} Y_A \quad (32)$$

Since $Y_A$, $T_{mDC}$ and $T_{mC}$ are now known, equation (32) can be solved by the processor 250 to obtain $T_D$ without requiring that the arbitrary thru be a reciprocal device and without requiring knowledge of its $S_{21}$ phase shift as follows:

$$T_D = \begin{bmatrix} \dfrac{(a_A + b_A \cdot c_A)}{(-a_A + b_A \cdot c_A)} & \dfrac{-b_A \cdot (a_A + b_A \cdot c_A)}{(-a_A + b_A \cdot c_A)} \\ \dfrac{c_A \cdot (a_A + b_A \cdot c_A)}{(-a_A + b_A \cdot c_A)} & \dfrac{-a_A \cdot (a_A + b_A \cdot c_A)}{(-a_A + b_A \cdot c_A)} \end{bmatrix} \begin{bmatrix} T_{11mDC} & T_{12mDC} \\ T_{21mDC} & T_{22mDC} \end{bmatrix} \quad (33)$$

$$\dfrac{1}{(T_{11mC} \cdot T_{22mC} - T_{12mC} \cdot T_{21mC})} \begin{bmatrix} T_{22mC} & -T_{12mC} \\ -T_{21mC} & T_{11mC} \end{bmatrix}$$

$$\begin{bmatrix} \dfrac{1}{(a_B + b_B \cdot c_B)} & \dfrac{-c_B}{(a_B + b_B \cdot c_B)} \\ \dfrac{b_B}{(a_B + b_B \cdot c_B)} & \dfrac{-a_B}{(a_B + B_B \cdot c_B)} \end{bmatrix}$$

Solving for the individual transmission parameters of $T_D$ we obtain:

$$T_{11D} = \dfrac{\begin{array}{c}(-T_{12mC} \cdot T_{11mDC} + T_{12mC} \cdot b_A \cdot T_{21mDC} + \\ T_{11mC} \cdot T_{12mDC} - T_{11mC} \cdot b_A \cdot T_{22mDC}) \cdot c_A\end{array}}{(a_A - b_A \cdot c_A) \cdot (T_{11mC} \cdot T_{22mC} - T_{12mC} \cdot T_{21mC})} \quad (34)$$

$$+ \dfrac{\begin{array}{c}(T_{22mC} \cdot T_{11mDC} - T_{22mC} \cdot b_A \cdot T_{21mDC} - \\ T_{21mC} \cdot T_{12mDC} + T_{21mC} \cdot b_A \cdot T_{22mDC}) \cdot a_A\end{array}}{(a_A - b_A \cdot C_A) \cdot (T_{11mC} \cdot T_{22mC} - T_{12mC} \cdot T_{21mC})}$$

$$T_{21D} = \dfrac{(-T_{12mC} \cdot T_{11mDC} + T_{11mC} \cdot T_{12mDC}) \cdot (c_A)^2}{(a_A - b_A \cdot c_A) \cdot (T_{11mC} \cdot T_{22mC} - T_{12mC} \cdot T_{21mC})} + \quad (35)$$

$$\dfrac{\begin{array}{c}(T_{12mC} \cdot T_{21mDC} - T_{11mC} \cdot T_{22mDC} + T_{22mC} \cdot T_{11mDC} - \\ T_{21mC} \cdot T_{12mDC}) \cdot a_A \cdot c_A\end{array}}{(a_A - b_A \cdot c_A) \cdot (T_{11mC} \cdot T_{22mC} - T_{12mC} \cdot T_{21mC})} +$$

$$\dfrac{(-T_{22mC} \cdot T_{21mDC} + T_{21mC} \cdot T_{22mDC}) \cdot (a_A)^2}{(a_A - b_A \cdot c_A) \cdot (T_{11mC} \cdot T_{22mC} - T_{12mC} \cdot T_{21mC})}$$

$$T_{12D} = \dfrac{(T_{22mC} \cdot T_{21mDC} - T_{21mC} \cdot T_{22mDC}) \cdot (b_A)^2}{(a_A - b_A \cdot c_A) \cdot (T_{11mC} \cdot T_{22mC} - T_{12mC} \cdot T_{21mC})} + \quad (36)$$

$$\dfrac{\begin{array}{c}(-T_{12mC} \cdot T_{21mDC} + T_{11mC} \cdot T_{22mDC} - \\ T_{22mC} \cdot T_{11mDC} + T_{21mC} \cdot T_{12mDC}) \cdot b_A\end{array}}{(a_A - b_A \cdot c_A) \cdot (T_{11mC} \cdot T_{22mC} - T_{12mC} \cdot T_{21mC})} +$$

$$\dfrac{T_{12mC} \cdot T_{11mDC} - T_{11mC} \cdot T_{12mDC}}{(a_A - b_A \cdot c_A) \cdot (T_{11mC} \cdot T_{22mC} - T_{12mC} \cdot T_{21mC})}$$

$$T_{22D} = \dfrac{\begin{array}{c}[(-T_{22mC} \cdot T_{11mDC} + T_{21mC} \cdot T_{12mDC}) \cdot \\ b_A + T_{12mC} \cdot T_{11mDC} - T_{11mC} \cdot T_{12mDC}] \cdot c_A\end{array}}{(a_A - b_A \cdot c_A) \cdot (T_{11mC} \cdot T_{22mC} - T_{12mC} \cdot T_{21mC})} + \quad (37)$$

$$\dfrac{\begin{array}{c}[(T_{22mC} \cdot T_{21mDC} - T_{21mC} \cdot T_{22mDC}) \cdot \\ b_A - T_{12mC} \cdot T_{21mDC} + T_{11mC} \cdot T_{22mDC}] \cdot a_A\end{array}}{(a_A - b_A \cdot c_A) \cdot (T_{11mC} \cdot T_{22mC} - T_{12mC} \cdot T_{21mC})}$$

Once the transmission parameters for the arbitrary DUT are determined, the following matrix can be solved by the processor 250 to determine the actual S-parameters, $S_D$, for the arbitrary DUT:

$$S_D = \begin{bmatrix} \dfrac{T12_D}{T22_D} & \dfrac{det(T_D)}{T22_D} \\ \dfrac{1}{T22_D} & \dfrac{-T21_D}{T22_D} \end{bmatrix} \quad (38)$$

Figure 6:
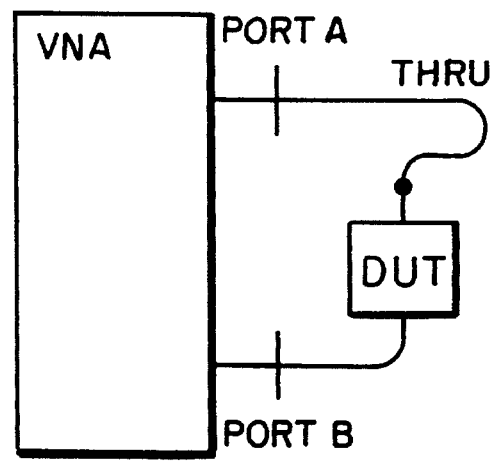
FIG. 6 illustrates measurement of a device under test in series with a thru line with the thru line connected directly to port A.

Equation (31) assumes that the arbitrary thru is connected directly to port B, as illustrated in FIG. 5. Should the arbitrary thru be connected directly to port A, as illustrated in FIG. 6, equation (31) is rewritten as follows:

$$T_{mDC} = \alpha Y_A T_C T_D Y_B^{-1} \quad (39)$$

Substituting $T_c$ from equation (30) into equation (39) and solving for $T_D$ we obtain:

$$T_D = Y_B^{-1} T_{mC}^{-1} T_{mCD} Y_B \quad (40)$$

Since $Y_B$, $T_{mC}$ and $T_{mC}$ are now known, equation (40) can be solved by the processor 250, similar to equation (32) to obtain $T_D$ without requiring that the arbitrary thru be a reciprocal device and without requiring knowledge of its $S_{21}$ phase shift.

Because the arbitrary thru can be connected directly to either port A or port B during measurement of an arbitrary DUT, the processor 250 is programmed to determine the S-parameters of the arbitrary DUT utilizing either of equations (32) or (40). The user must indicate to the processor 250 which equation to use utilizing the I/O control unit, such as keypad 254, to note which port the arbitrary thru line is directly connected.

Conclusion

Although the invention has been described above with particularity, this was merely to teach one of ordinary skill in the art how to make and use the invention. Many modifications will fall within the scope of the invention, as that scope is defined by the following claims.

What is claimed is:

1. A vector network analyzer (VNA) comprising:

a reflectometer;

a measurement port A;

internal calibration standards;

a switch having a first end connected to the reflectometer and a second end rement port A;

a processor; and a memory for storing a data structure comprising:

error terms of an error matrix to account for measurement error between the measurement port A and the reflectometer wherein the error matrix is defined as follows:

$$E_A = \begin{bmatrix} e00_A & e01_A \\ e10_A & e11_A \end{bmatrix}$$

and wherein the error terms comprise;

$a_A = -det(E_A);$ $b_A = e00_A;$ and $c_A = e11_A.$

2. The VNA of claim 1 wherein initial values for $a_A$, $b_A$ and $c_A$ are determined by the processor using a solution to the following matrix of equations:

$$\begin{bmatrix} \Gamma m1 \\ \Gamma m2 \\ \Gamma m3 \end{bmatrix} = \begin{bmatrix} \Gamma c1 & 1 & -(\Gamma m1 \cdot \Gamma c1) \\ \Gamma c2 & 1 & -(\Gamma m2 \cdot \Gamma c2) \\ \Gamma c3 & 1 & -(\Gamma m3 \cdot \Gamma c3) \end{bmatrix} \begin{bmatrix} a_A \\ b_A \\ c_A \end{bmatrix}$$

wherein:

$\Gamma m1$, $\Gamma m2$ and $\Gamma m3$ are the measured reflection coefficients for three external calibration standards individually connected to the measurement port A with the switch controlled to connect the measurement port A to the reflectometer; and $\Gamma c1$, $\Gamma c2$ and $\Gamma c3$ are known reflection coefficients for the three external calibration standards.

3. The VNA of claim 2 wherein:

$$a_A = \frac{(\Gamma m1 \cdot \Gamma m3 \cdot \Gamma c3 - \Gamma m1 \cdot \Gamma m2 \cdot \Gamma c2 - \Gamma m2 \cdot \Gamma m3 \cdot \Gamma c3 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 +}$$

$$\frac{\Gamma m2 \cdot \Gamma m1 \cdot \Gamma c1 + \Gamma m3 \cdot \Gamma m2 \cdot \Gamma c2 - \Gamma m3 \cdot \Gamma m1 \cdot \Gamma c1)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)};$$

$$b_A = \frac{(-\Gamma c3 \cdot \Gamma c2 \cdot \Gamma m1 \cdot \Gamma m3 + \Gamma c3 \cdot \Gamma c2 \cdot \Gamma m1 \cdot \Gamma m2 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot}$$

$$\frac{\Gamma c3 \cdot \Gamma c1 \cdot \Gamma m2 \cdot \Gamma m3 - \Gamma c3 \cdot \Gamma c1 \cdot \Gamma m2 \cdot \Gamma m1 -}{\Gamma c3 + \Gamma c2 \cdot \Gamma m1 \cdot \Gamma c1 + \Gamma c3 \cdot \Gamma m1 \cdot \Gamma c2 - \Gamma c3 \cdot}$$

$$\frac{\Gamma c2 \cdot \Gamma c1 \cdot \Gamma m3 \cdot \Gamma m2 + \Gamma c2 \cdot \Gamma c1 \cdot \Gamma m3 \cdot \Gamma m1)}{\Gamma m1 \cdot \Gamma c1)}; \text{ and}$$

$$c_A = \frac{(\Gamma c2 \cdot \Gamma m1 - \Gamma c3 \cdot \Gamma m1 - \Gamma c1 \cdot \Gamma m2 + \Gamma c3 \cdot \Gamma m2 + \Gamma c1 \cdot}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 \cdot}$$

$$\frac{\Gamma m3 - \Gamma c2 \cdot \Gamma m3)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)}.$$

4. The VNA of claim 2 wherein the data structure of the memory further comprises:

characterizing reflection coefficients, $\Gamma ci$, for the internal calibration standards for use by the processor to recalculate the error terms of the error matrix, the characterizing reflection coefficients, $\Gamma ci$, being determined by controlling the switch to connect the reflectometer to the internal calibration standards to obtain a set of measured reflection coefficients, $\Gamma mi$, and wherein the processor utilizes the initial values of $a_A$, $b_A$ and $c_A$ to provide a solution to the following equation for each of the internal calibration standards:

$$\Gamma ci = \frac{\Gamma mi - b}{a + \Gamma mi \cdot c}.$$

5. The VNA of claim 4 wherein the error terms $a_A$, $b_A$ and $c_A$ are recalculated by the processor using a solution to the following matrix of equations:

$$\begin{bmatrix} \Gamma mi1 \\ \Gamma mi2 \\ \Gamma mi3 \end{bmatrix} = \begin{bmatrix} \Gamma ci1 & 1 & -(\Gamma mi1 \cdot \Gamma ci1) \\ \Gamma ci2 & 1 & -(\Gamma mi2 \cdot \Gamma ci2) \\ \Gamma ci3 & 1 & -(\Gamma mi3 \cdot \Gamma ci3) \end{bmatrix} \begin{bmatrix} a_A \\ b_A \\ c_A \end{bmatrix}$$

wherein:

$\Gamma ci1$, $\Gamma ci2$ and $\Gamma ci3$ are the characterizing reflection coefficients, $\Gamma ci$, for the internal calibration standards; and $\Gamma mi1$, $\Gamma mi2$ and $\Gamma mi3$ are the measured reflection coefficients, $\Gamma mi$, for the internal calibration standards taken by controlling the switch to connect the reflectometer to the internal calibration standards.

6. A method of determining S-parameters for device under test (DUT) utilizing a vector network analyzer (VNA) of claim 5 with the VNA having an additional measurement port B, the method using a thru line, the method comprising the steps of:

measuring raw S-parameters with the thru line connected from the measurement port A to the measurement port B;

converting the raw S-parameters measured for the thru device to transmission parameters, $T_{mC}$;

measuring raw S-parameters with the thru device connected in series with the DUT between the measurement ports A and B, wherein the thru line is connected directly to the measurement port B;

converting the raw S-parameters measured for the thru line in series with the DUT to transmission parameters, $T_{mDC}$;

calculating the transmission parameters for the DUT, $T_D$, by obtaining a solution to the following matrix equation:

$$T_D = Y_A^{-1} T_{mDC} T_{mC}^{-1} Y_A$$

wherein:

$$Y_A = \begin{bmatrix} \dfrac{-a_A}{(a_A + b_A \cdot c_A)} & \dfrac{b_A}{(a_A + b_A \cdot c_A)} \\ \dfrac{-c_A}{(a_A + b_A \cdot c_A)} & \dfrac{1}{(a_A + b_A \cdot c_A)} \end{bmatrix};$$

and converting the transmission parameters for the DUT, $T_D$, to S-parameters.

7. A method of measuring S-parameters for a device under test (DUT) using a vector network analyzer (VNA) having a reflectometer, a measurement port A, and a measurement port B, the method utilizing three reflection calibration standards and a thru calibration standards, the method comprising:

measuring reflection coefficients for the three reflection calibration standards for the measurement port A of the VNA;

calculating actual reflection coefficients utilizing error terms $a_A$, $b_A$, $C_A$ for an error matrix $E_A$ between the measurement port A and the reflectometer utilizing the measured reflection coefficients for the three reflection calibration standards and known reflection coefficients for the three reflection calibration standards, wherein:

$$E_A = \begin{bmatrix} e00_A & e01_A \\ e10_A & e11_A \end{bmatrix};$$

$a_A = -det(E_A);$ $b_A = e00_A;$ and $c_A = e11_A$ and wherein:

$$a_A = \frac{(\Gamma m1 \cdot \Gamma m3 \cdot \Gamma c3 - \Gamma m1 \cdot \Gamma m2 \cdot \Gamma c2 - \Gamma m2 \cdot \Gamma m3 \cdot \Gamma c3 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 +}$$

$$\frac{\Gamma m2 \cdot \Gamma m1 \cdot \Gamma c1 + \Gamma m3 \cdot \Gamma m2 \cdot \Gamma c2 - \Gamma m3 \cdot \Gamma m1 \cdot \Gamma c1)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)};$$

$$b_A = \frac{(-\Gamma c3 \cdot \Gamma c2 \cdot \Gamma m1 \cdot \Gamma m3 + \Gamma c3 \cdot \Gamma c2 \cdot \Gamma m1 \cdot \Gamma m2 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot}$$

$$\frac{\Gamma c3 \cdot \Gamma c1 \cdot \Gamma m2 \cdot \Gamma m3 - \Gamma c3 \cdot \Gamma c1 \cdot \Gamma m2 \cdot \Gamma m1 -}{\Gamma c3 + \Gamma c2 \cdot \Gamma m1 \cdot \Gamma c1 + \Gamma c3 \cdot \Gamma m1 \cdot \Gamma c2 - \Gamma c3 \cdot}$$

-continued $$\frac{\Gamma c2 \cdot \Gamma c1 \cdot \Gamma m3 \cdot \Gamma m2 + \Gamma c2 \cdot \Gamma c1 \cdot \Gamma m3 \cdot \Gamma m1)}{\Gamma m1 \cdot \Gamma c1)} \text{ ; and}$$

$$c_A = \frac{(\Gamma c2 \cdot \Gamma m1 - \Gamma c3 \cdot \Gamma m1 - \Gamma c1 \cdot \Gamma m2 + \Gamma c3 \cdot \Gamma m2 + \Gamma c1 \cdot}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 \cdot}$$

$$\frac{\Gamma m3 - \Gamma c2 \cdot \Gamma m3)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)}$$

wherein $\Gamma m1$, $\Gamma m2$ and $\Gamma m3$ are the measured reflection coefficients for the three reflection calibration standards; and $\Gamma c1$, $\Gamma c2$ and $\Gamma c3$ are known reflection coefficients for the three reflection calibration standards;

measuring raw S-parameters for the thru line connected from the measurement port A to the measurement port B;

converting the raw S-parameters measured for the thru line to transmission parameters, $T_{mC}$;

measuring the raw S-parameters of the DUT connected in series with the thru line between the measurement ports A and B with the thru line connected directly to the measurement port B;

converting the raw S-parameters measured for the DUT connected in series with the thru line to transmission parameters, $T_{mDC}$;

calculating the transmission parameters for the DUT, $T_D$, by obtaining a solution to the following matrix equation:

$$T_D = Y_A^{-1} T_{mDC} T_{mC}^{-1} Y_A$$

wherein $$Y_A = \begin{bmatrix} \dfrac{-a_A}{(a_A + b_A \cdot c_A)} & \dfrac{b_A}{(a_A + b_A \cdot c_A)} \\ \dfrac{-c_A}{(a_A + b_A \cdot c_A)} & \dfrac{1}{(a_A + b_A \cdot c_A)} \end{bmatrix} ;$$

and converting the transmission parameters for the DUT, $T_D$, to S-parameters.

8. A method of measuring S-parameters for a device under test (DUT) using a vector network analyzer (VNA) having a reflectometer, a measurement port A, and a measurement port B, the method utilizing three reflection calibration standards and a thru calibration standard, the method comprising:

measuring reflection coefficients for the three reflection calibration standards for the measurement port A of the VNA, wherein the three reflection calibration standards are connected to the reflectometer separate from the measurement ports A and B and the three reflection calibration standards are contained within the housing of the VNA;

calculating actual reflection coefficients utilizing error terms $a_A$, $b_A$, $C_A$ for an error matrix $E_A$ between the measurement port A and the reflectometer utilizing the measured reflection coefficients for the three reflection calibration standards and known reflection coefficients for the three reflection calibration standards, wherein:

$$E_A = \begin{bmatrix} e00_A & e01_A \\ e10_A & e11_A \end{bmatrix} ;$$

$a_A = -det(E_A)$;

$b_A = e00_A$; and $c_A = e11_A$;

measuring raw S-parameters for the thru line connected from the measurement port A to the measurement port B;

converting the raw S-parameters measured for the thru line to transmission parameters, $T_{mC}$;

measuring the raw S-parameters of the DUT connected in series with the thru line between the measurement ports A and B with the thru line connected directly to the measurement port B;

converting the raw S-parameters measured for the DUT connected in series with the thru line to transmission parameters, $T_{mDC}$;

calculating the transmission parameters for the DUT, $T_D$, by obtaining a solution to the following matrix equation:

$$T_D = Y_A^{-1} T_{mDC} T_{mC}^{-1} Y_A$$

wherein:

$$Y_A = \begin{bmatrix} \dfrac{-a_A}{(a_A + b_A \cdot c_A)} & \dfrac{b_A}{(a_A + b_A \cdot c_A)} \\ \dfrac{-c_A}{(a_A + b_A \cdot c_A)} & \dfrac{1}{(a_A + b_A \cdot c_A)} \end{bmatrix} ;$$

and converting the transmission parameters for the DUT, $T_D$, to S-parameters.

9. A method of measuring S-parameters for a device under test (DUT) using a vector network analyzer (VNA) having a reflectometer, a measurement port A, and a measurement port B, the method utilizing three reflection calibration standards and a thru calibration standard, the method comprising:

measuring reflection coefficients for the three reflection calibration standards for the measurement port B of the VNA;

calculating actual reflection coefficients utilizing error terms $a_B$, $b_B$, $C_B$ for an error matrix $E_B$ between the measurement port B and the reflectometer utilizing the measured reflection coefficients for the three reflection calibration standards and known reflection coefficients for the three reflection calibration standards, wherein:

$$E_A = \begin{bmatrix} e00_A & e01_A \\ e10_A & e11_A \end{bmatrix} ;$$

$a_A = -det(E_A)$;

$b_A = e00_A$; and $c_A = e11_A$;

and wherein:

$$a_A = \frac{(\Gamma m1 \cdot \Gamma m3 \cdot \Gamma c3 - \Gamma m1 \cdot \Gamma m2 \cdot \Gamma c2 - \Gamma m2 \cdot \Gamma m3 \cdot \Gamma c3 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 +}$$

$$\frac{\Gamma m2 \cdot \Gamma m1 \cdot \Gamma c1 + \Gamma m3 \cdot \Gamma m2 \cdot \Gamma c2 - \Gamma m3 \cdot \Gamma m1 \cdot \Gamma c1)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)} ;$$

$$b_A = \frac{(-\Gamma c3 \cdot \Gamma c2 \cdot \Gamma m1 \cdot \Gamma m3 + \Gamma c3 \cdot \Gamma c2 \cdot \Gamma m1 \cdot \Gamma m2 +}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot}$$

$$\frac{\Gamma c3 \cdot \Gamma c1 \cdot \Gamma m2 \cdot \Gamma m3 - \Gamma c3 \cdot \Gamma c1 \cdot \Gamma m2 \cdot \Gamma m1 -}{\Gamma c3 + \Gamma c2 \cdot \Gamma m1 \cdot \Gamma c1 + \Gamma c3 \cdot \Gamma m1 \cdot \Gamma c2 - \Gamma c3 \cdot}$$

-continued
$$\frac{\Gamma c2 \cdot \Gamma c1 \cdot \Gamma m3 \cdot \Gamma m2 + \Gamma c2 \cdot \Gamma c1 \cdot \Gamma m3 \cdot \Gamma m1)}{\Gamma m1 \cdot \Gamma c1)} \text{; and}$$

$$c_A = \frac{(\Gamma c2 \cdot \Gamma m1 - \Gamma c3 \cdot \Gamma m1 - \Gamma c1 \cdot \Gamma m2 + \Gamma c3 \cdot \Gamma m2 + \Gamma c1 \cdot}{(\Gamma c1 \cdot \Gamma m3 \cdot \Gamma c3 - \Gamma c1 \cdot \Gamma m2 \cdot \Gamma c2 - \Gamma c2 \cdot \Gamma m3 \cdot \Gamma c3 \cdot}$$

$$\frac{\Gamma m3 - \Gamma c2 \cdot \Gamma m3)}{\Gamma c2 \cdot \Gamma m1 \cdot \Gamma c1 + \Gamma c3 \cdot \Gamma m2 \cdot \Gamma c2 - \Gamma c3 \cdot \Gamma m1 \cdot \Gamma c1)}$$

wherein:

$\Gamma m1$, $\Gamma m2$ and $\Gamma m3$ are the measured reflection coefficients for the three reflection calibration standards; and $\Gamma c1$, $\Gamma c2$ and $\Gamma c3$ are known reflection coefficients for the three reflection calibration standards;

measuring raw S-parameters for the thru line connected from the measurement port A to the measurement port B;

converting the raw S-parameters measured for the thru line to transmission parameters, $T_{mC}$;

measuring the raw S-parameters of the DUT connected in series with the thru line between the measurement ports A and B with the thru line connected directly to the measurement port A;

converting the raw S-parameters measured for the DUT connected in series with the thru line to transmission parameters, $T_{mCD}$;

calculating the transmission parameters for the DUT, $T_D$, by obtaining a solution to the following matrix equation:

$$T_D = Y_A^{-1} T_{mDC} T_{mC}^{-1} Y_A$$

wherein:

$$Y_A = \begin{bmatrix} \frac{-a_A}{(a_A + b_A \cdot c_A)} & \frac{b_A}{(a_A + b_A \cdot c_A)} \\ \frac{-c_A}{(a_A + b_A \cdot c_A)} & \frac{1}{(a_A + b_A \cdot c_A)} \end{bmatrix};$$

and converting the transmission parameters for the DUT, $T_D$, to S-parameters.

10. A method of measuring S-parameters for a device under test (DUT) using a vector network analyzer (VNA) having a reflectometer, a measurement port A, a measurement port B, the method utilizing reflection calibration standards A and reflection calibration standards B, the method comprising:

measuring reflection coefficients for reflection calibration standards A for the measurement port A of the VNA;

calculating actual reflection coefficients utilizing error terms $a_A$, $b_A$, $c_A$ for an error matrix $E_A$ between the measurement port A and the reflectometer utilizing the measured reflection coefficients for the reflection calibration standards A and known reflection coefficients for the reflection calibration standards A, wherein:

$$E_A = \begin{bmatrix} e00_A & e01_A \\ e10_A & e11_A \end{bmatrix};$$

$a_A = -det(E_A)$;

$b_A = e00_A$; and $c_A = e11_A$;

measuring reflection coefficients for the reflection calibration standards B for the measurement port B of the VNA;

calculating actual reflection coefficients utilizing error terms $a_B$, $b_B$, $c_B$ for an error matrix $E_B$ between the measurement port B and the reflectometer utilizing the measured reflection coefficients for the reflection calibration standards B and known reflection coefficients for the reflection calibration standards B, wherein:

$$E_B = \begin{bmatrix} e00_B & e01_B \\ e10_B & e11_B \end{bmatrix};$$

$a_B = -det(E_B)$;

$b_B = e00_B$; and $c_B = e11_B$;

measuring raw S-parameters for the thru line connected from the measurement port A to the measurement port B;

converting the raw S-parameters measured for the thru line to transmission parameters, $T_{mC}$;

measuring the raw S-parameters of the DUT connected in series with the thru line between the measurement ports A and B;

determining whether the thru line is connected directly to the measurement port A or to the measurement port B;

converting the raw S-parameters measured for the DUT connected in series with the thru line to transmission parameters, $T_{mDC}$;

calculating the transmission parameters for the DUT, $T_D$, by obtaining a solution to the following matrix equation if the thru line was connected directly to measurement port B:

$$T_D = Y_A^{-1} T_{mDC} T_{mC}^{-1} Y_A$$

wherein:

$$Y_A = \begin{bmatrix} \frac{-a_A}{(a_A + b_A \cdot c_A)} & \frac{b_A}{(a_A + b_A \cdot c_A)} \\ \frac{-c_A}{(a_A + b_A \cdot c_A)} & \frac{1}{(a_A + b_A \cdot c_A)} \end{bmatrix};$$

calculating the transmission parameters for the DUT, $T_D$, by obtaining a solution to the following matrix equation if the thru line was connected directly to measurement port A:

$$T_D = Y_B^{-1} T_{mC}^{-1} T_{mDC} Y_B$$

wherein:

$$Y_B = \begin{bmatrix} \frac{1}{(a_B + b_B \cdot c_B)} & \frac{-c_B}{(a_B + b_B \cdot c_B)} \\ \frac{b_B}{(a_B + b_B \cdot c_B)} & \frac{-a_B}{(a_B + b_B \cdot c_B)} \end{bmatrix};$$

and converting the transmission parameters for the DUT, $T_D$, to S-parameters.

11. A method of calibrating a vector network analyzer (VNA) having a reflectometer, a measurement port A, a measurement port B, internal reflection calibration standards A, internal reflection calibration standards B, a switch A having a first end connected to the reflectometer and a second end connectable to the internal reflection calibration standards A or the measurement port A and a switch B having a first end connected to the reflectometer and a second end connectable to the internal reflection calibration standards B or the measurement port B, the method utilizing a reciprocal thru line having a known sign for its $S_{21}$ value, $S_{21C}$, the method comprising:

measuring reflection coefficients for the internal reflection calibration standards A by activating the switch A to connect the reflectometer to each of the internal reflection calibration standards A;

calculating actual reflection coefficients utilizing error terms $a_A$, $b_A$, $c_A$ for an error matrix $E_A$ between the measurement port A and the reflectometer utilizing the measured reflection coefficients for the internal reflection calibration standards A and known reflection coefficients for the internal reflection calibration standards A, wherein:

$$E_A = \begin{bmatrix} e00_A & e01_A \\ e10_A & e11_A \end{bmatrix};$$

$a_A = -det(E_A)$;

$b_A = e00_A$; and $c_A = e11_A$;

measuring reflection coefficients for the internal reflection calibration standards B by activating the switch B to connect the reflectometer to each of the internal reflection calibration standards B;

calculating actual reflection coefficients utilizing error terms $a_B$, $b_B$, $c_B$ for an error matrix $E_A$ between the measurement port A and the reflectometer utilizing the measured reflection coefficients for internal reflection calibration standards B and known reflection coefficients for the internal reflection calibration standards B, wherein:

$$E_B = \begin{bmatrix} e00_B & e01_B \\ e10_B & e11_B \end{bmatrix};$$

$a_B = -det(E_B)$;

$b_B = e00_B$; and $c_B = e11_B$;

measuring raw S-parameters for the reciprocal thru line connected from the measurement port A to the measurement port B by activating switch A to connect the reflectometer to the measurement port A and by activating switch B to connect the reflectometer to the measurement port B;

converting the raw S-parameters measured for the reciprocal thru to transmission parameters, $T_{mC}$;

calculating a value for $\alpha$ wherein:

$$\alpha = \pm \sqrt{\frac{det(T_{mC}) det(Y_B)}{det(Y_A)}}$$

wherein:

$$Y_A = \begin{bmatrix} \frac{-a_A}{(a_A + b_A \cdot c_A)} & \frac{b_A}{(a_A + b_A \cdot c_A)} \\ \frac{-c_A}{(a_A + b_A \cdot c_A)} & \frac{1}{(a_A + b_A \cdot c_A)} \end{bmatrix}; \text{ and}$$

$$Y_B = \begin{bmatrix} \frac{1}{(a_B + b_b \cdot c_B)} & \frac{-c_B}{(a_B + b_B \cdot c_B)} \\ \frac{b_B}{(a_B + b_B \cdot c_B)} & \frac{-a_B}{(a_B + b_B \cdot c_B)} \end{bmatrix}$$

and the sign of alpha is determined from the sign of $S_{21C} = \alpha/X_{22}$ wherein:

$X = Y_A^{-1} T_{mC} Y_B$.

12. A method of measuring S-parameters for a device under test (DUT) using the VNA calibrated according to the method of claim 11, the method comprising the steps of:

measuring the raw S-parameters of the DUT connected in series with the reciprocal thru between the measurement ports A and B;

converting the raw S-parameters measured for the DUT connected in series with the reciprocal thru to transmission parameters, $T_{mDC}$;

calculating the transmission parameters for the DUT, $T_D$, by obtaining solutions to the following matrix equations:

$T_{DC} = \alpha^{-1} Y_A^{-1} T_{mDC} Y_B$;

$T_C = \alpha^{-1} Y_A^{-1} T_{mC} Y_B$; and $T_D = T_{DC} T_C^{-1}$; and converting the transmission parameters for the DUT, $T_D$, to S-parameters.

13. A method of measuring S-parameters for a device under test (DUT) using a vector network analyzer (VNA) having a reflectometer, a measurement port A and a measurement port B, the method utilizing reflection calibration standards, the method comprising;

measuring reflection coefficients for the reflection calibration standards for the measurement port A of the VNA;

calculating actual reflection coefficients utilizing error terms $a_A u$, $b_A$, $c_A$ for an error matrix $E_A$ between the measurement port A and the reflectometer utilizing the measured reflection coefficients for the reflection calibration standards and known reflection coefficients for the reflection calibration standards, wherein:

$$E_A = \begin{bmatrix} e00_A & e01_A \\ e10_A & e11_A \end{bmatrix};$$

$a_A = -det(E_A)$;

$b_A = e00_A$; and $c_A = e11_A$;

measuring raw S-parameters for the thru line connected from the measurement port A to the measurement port B;

measuring the raw S-parameters of the DUT connected in series with the thru line between the measurement ports A and B;

utilizing the actual reflection coefficients, the raw S-parameters of the DUT and the raw S-parameters of the thru line without utilizing a measurement of the length of the thru line and without utilizing a determination of the phase shift of the thru line to determine the S-parameters for the DUT.

* * * * *

UNITED STATES PATENT AND TRADEMARK OFFICE
CERTIFICATE OF CORRECTION

PATENT NO. : 5,548,538
DATED : August 20, 1996
INVENTOR(S) : Grace, et al.

Page 1 of 4

It is certified that error appears in the above-indentified patent and that said Letters Patent is hereby corrected as shown below:

On the Cover Page under "References Cited", add --5,276,411, 1/1994, Woodin, Jr. et al., 333/22--; --5,434,511, 7/1995, Adamian et al., 324/601--; and --5,467,021, 11/1995, Adamian et al., 324/601--.

Col. 8, between lines 20 and 24, delete "$S_{21c}$" and substitute therefor --$S_{21C}$--.

Col. 9, between lines 18 and 33 in the equation for $T_D$ delete "-$T_{12C}$" and substitute therefor --$T_{12C}$--.

Col. 9 between lines 36 and 49 in the equation for $S_D$, delete "($T_{11DC}$" and substitute therefor -- -($T_{11DC}$--.

Col. 10, line 52, after "$T_D$," insert --$\propto$--.

Col. 12, line 18, after "$Y_B$," delete "$T_{mC}$", first occurrence, and substitute therefor --$T_{mCD}$--.

UNITED STATES PATENT AND TRADEMARK OFFICE
CERTIFICATE OF CORRECTION

PATENT NO. : 5,548,538
DATED : August 20, 1996
INVENTOR(S) : Grace, et al.

It is certified that error appears in the above-indentified patent and that said Letters Patent is hereby corrected as shown below:

Col. 12, line 46, after "end" delete "rement" and substitute therefor --selectively connectible to the internal calibration standards or the measurement--.

Col. 14, line 41, delete "$C_A$" and substitute therefor --$c_A$--.

Col. 15, line 55, delete "$C_A$" and substitute therefor --$c_A$--.

Col. 16, line 41, delete "$C_B$" and substitute therefor --$c_B$--.

Col. 18, line 2, delete "$C_B$" and substitute therefor --$c_B$--.

Col. 20, line 46, after "$a_A$" delete "u".

Col. 13, line 65, after "for" insert --a--.

Col. 14, line 35, delete "standards" and substitute therefor --standard--.

Col. 16, line 56 through Col. 17, line 6, delete "$a_A$" and substitute therefor --$a_B$--; delete "$b_A$" and substitute therefor --$b_B$--; and delete "$c_A$" and substitute therefor --$c_B$--.

UNITED STATES PATENT AND TRADEMARK OFFICE
CERTIFICATE OF CORRECTION

PATENT NO. : 5,548,538

DATED : August 20, 1996

INVENTOR(S) : Grace, et al.

It is certified that error appears in the above-indentified patent and that said Letters Patent is hereby corrected as shown below:

Col. 16, lines 45-55, delete "$_A$", all occurrences, and substitute therefor --$_B$--; and col. 17, lines 29-37, delete "$$T_D = Y_A^{-1} T_{mDC} T_{mc}^{-1} Y_A$$

wherein:

$$Y_A = \begin{bmatrix} \dfrac{-a_A}{(a_A + b_A \cdot C_A)} & \dfrac{b_A}{(a_A + b_A \cdot C_A)} \\ \dfrac{-C_A}{(a_A + b_A \cdot C_A)} & \dfrac{1}{(a_A + b_A \cdot C_A)} \end{bmatrix} ;$$ "

UNITED STATES PATENT AND TRADEMARK OFFICE
CERTIFICATE OF CORRECTION

PATENT NO. : 5,548,538
DATED : August 20, 1996
INVENTOR(S) : Grace, et al.

It is certified that error appears in the above-indentified patent and that said Letters Patent is hereby corrected as shown below:

and substitute therefor $$-- T_0 = Y_\beta^{-1} T_{mc}^{-1} T_{mDC} Y_\beta$$

wherein:

$$\begin{bmatrix} \dfrac{1}{(a_\beta + b_\beta \cdot c_\beta)} & \dfrac{-c_\beta}{(a_\beta + b_\beta \cdot c_\beta)} \\ \dfrac{b_\beta}{(a_\beta + b_\beta \cdot c_\beta)} & \dfrac{-a_\beta}{(a_\beta + b_\beta \cdot c_\beta)} \end{bmatrix} ; --$$

Signed and Sealed this

Fourteenth Day of January, 1997

Attest:

BRUCE LEHMAN

*Attesting Officer*  *Commissioner of Patents and Trademarks*